United States Patent
Maurino et al.

(10) Patent No.: US 9,800,262 B1
(45) Date of Patent: Oct. 24, 2017

(54) PRECISION LOW NOISE CONTINUOUS TIME SIGMA DELTA CONVERTER

(71) Applicant: Analog Devices Global, Hamilton (BM)

(72) Inventors: Roberto Sergio Matteo Maurino, Turin (IT); Sanjay Rajasekhar, Newbury (GB); Pasquale Delizia, Newbury (GB); Colin G. Lyden, Baltimore (IE); Gabriel Banarie, Limerick (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 15/258,910

(22) Filed: Sep. 7, 2016

(51) Int. Cl.
  *H03M 3/00* (2006.01)
  *H03M 1/08* (2006.01)

(52) U.S. Cl.
  CPC ............. *H03M 3/464* (2013.01); *H03M 1/08* (2013.01)

(58) Field of Classification Search
  CPC .......... H03M 3/34; H03M 3/43; H03M 3/458; H03M 3/424; H03M 3/456; H03M 3/332; H03M 3/438; H03M 3/342; H03M 3/344; H03M 1/442; H03M 1/0663; H03M 3/30
  USPC ................................. 341/143, 172
  See application file for complete search history.

(56) References Cited

U.S. PATENT DOCUMENTS

| | | | |
|---|---|---|---|
| 6,040,793 A | 3/2000 | Ferguson, Jr. et al. | |
| 6,313,779 B1 * | 11/2001 | Leung | H03M 1/129 341/155 |
| 6,879,274 B2 | 4/2005 | Nestler et al. | |
| 6,940,445 B2 | 9/2005 | Kearney | |
| 7,659,840 B2 | 2/2010 | Edelson et al. | |
| 7,936,297 B2 | 5/2011 | Hurrell et al. | |
| 8,035,538 B2 | 10/2011 | Edelson et al. | |
| 8,106,809 B2 * | 1/2012 | Groenewold | H03M 3/34 341/143 |
| 8,514,117 B2 * | 8/2013 | Srinivasan | H03M 3/37 327/172 |
| 8,791,754 B2 | 7/2014 | Lyden | |
| 2005/0200510 A1 * | 9/2005 | Yoshida | H03M 1/1245 341/155 |
| 2007/0035426 A1 * | 2/2007 | Schreier | H03M 3/324 341/143 |
| 2013/0187803 A1 * | 7/2013 | Kaald | H03M 3/37 341/143 |
| 2014/0159930 A1 * | 6/2014 | Ho | H03M 3/32 341/143 |
| 2014/0167995 A1 * | 6/2014 | Tiew | H03M 3/30 341/143 |
| 2014/0197971 A1 * | 7/2014 | Kuppambatti | G06F 1/08 341/110 |

(Continued)

*Primary Examiner* — Linh Nguyen

(74) *Attorney, Agent, or Firm* — Schwegman Lundberg & Woessner, P.A.

(57) ABSTRACT

A sigma delta analog-to-digital converter (ADC) circuit comprises a capacitive gain amplifier circuit having a first input to receive an input voltage and a second input; a loop filter circuit connected to an output of the capacitive gain amplifier circuit; a sub-ADC circuit including an output and an input connected to an output of the loop filter circuit; and a digital-to-analog (DAC) circuit including a DAC input connected to the output of the sub-ADC circuit, and a DAC output connected to the second input of the capacitive gain amplifier.

21 Claims, 8 Drawing Sheets

(56) References Cited

U.S. PATENT DOCUMENTS

| | | | |
|---|---|---|---|
| 2014/0266827 A1* | 9/2014 | Ceballos | H03M 3/418 341/143 |
| 2015/0084798 A1* | 3/2015 | Nezuka | H03M 1/001 341/143 |
| 2015/0123828 A1* | 5/2015 | Alldred | H03M 3/442 341/143 |
| 2015/0263757 A1* | 9/2015 | Joish | H03M 1/66 341/122 |

* cited by examiner

PRECISION LOW NOISE CONTINUOUS TIME SIGMA DELTA CONVERTER

BACKGROUND

Electronic systems can include analog-to-digital (A/D) converters (ADCs). Converting analog signals to digital quantities allow processors of electronic systems to perform signal processing functions for the systems. The sigma delta ADC is one type of ADC and is used in converting signals in the audio band and in precision industrial measurement applications. Integrated circuit continuous time sigma delta ADCs can have poor performance on direct current (DC) signals. The present inventors have recognized a need for improved performance of ADCs.

OVERVIEW

This document relates generally to sigma delta analog-to-digital converter (ADC) circuits, and in particular to reducing circuit noise in ADC circuits.

An example sigma delta ADC circuit includes a capacitive gain amplifier circuit having a first input to receive an input voltage and a second input; a loop filter circuit connected to an output of the capacitive gain amplifier circuit; a sub-ADC circuit including an output and an input connected to an output of the loop filter circuit; and a digital-to-analog (DAC) circuit including a DAC input connected to the output of the sub-ADC circuit, and a DAC output connected to the second input of the capacitive gain amplifier.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
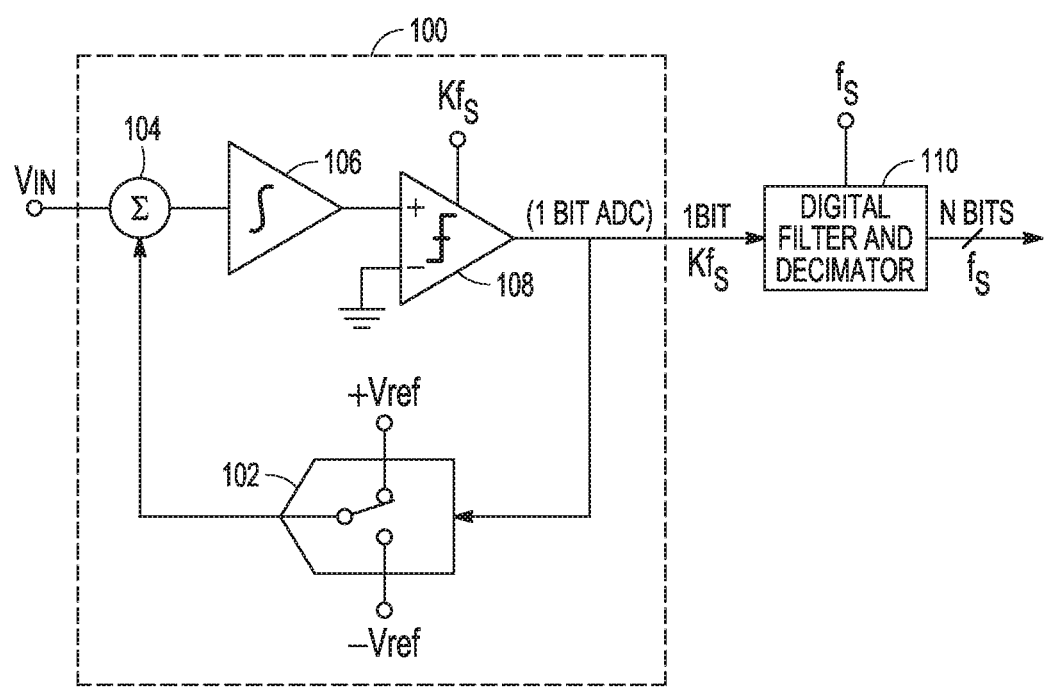
FIG. 1 is a block diagram of an example of a first order sigma delta ADC.

FIG. 1 is a block diagram of an example of a first order single bit sigma delta ADC. A sigma delta modulator 100 converts an input signal (Vin) into a continuous serial stream of ones and zeros at a rate determined by a sampling clock frequency $Kf_s$. A one-bit digital to analog converter (DAC) 102 is driven by the serial output data stream to generate a feedback signal. The output of the DAC 102 is subtracted from the input signal using a summing element 104. Typically, the summing element 104 is implemented as the summing junction of an operational amplifier (op amp) such as the op amp of the integrator 106. The integrator 106 integrates the output of summing element 104, and the output of the integrator 106 is applied to a clocked latched comparator 108.

For an input signal of zero, the comparator output includes an approximately equal number of ones and zeros. For a positive input voltage, the comparator output contains more ones than zeros. For a negative input voltage, the comparator output contains more zeros than ones. The average value of the comparator output over a number of cycles represents the input voltage. The comparator output is applied to a digital filter and decimator 110 that averages every M cycles, where M is a positive integer greater than 1. The decimator reduces the effective sampling rate at the output to $f_s$.

As mentioned previously herein, integrated circuit continuous time sigma delta ADCs can have poor noise performance on DC input signals. Part of the reason for the poor noise performance is that polysilicon resistors are often used in the summing element 104. Polysilicon resistors typically manifest a large, lower frequency flicker noise.

Figure 2:
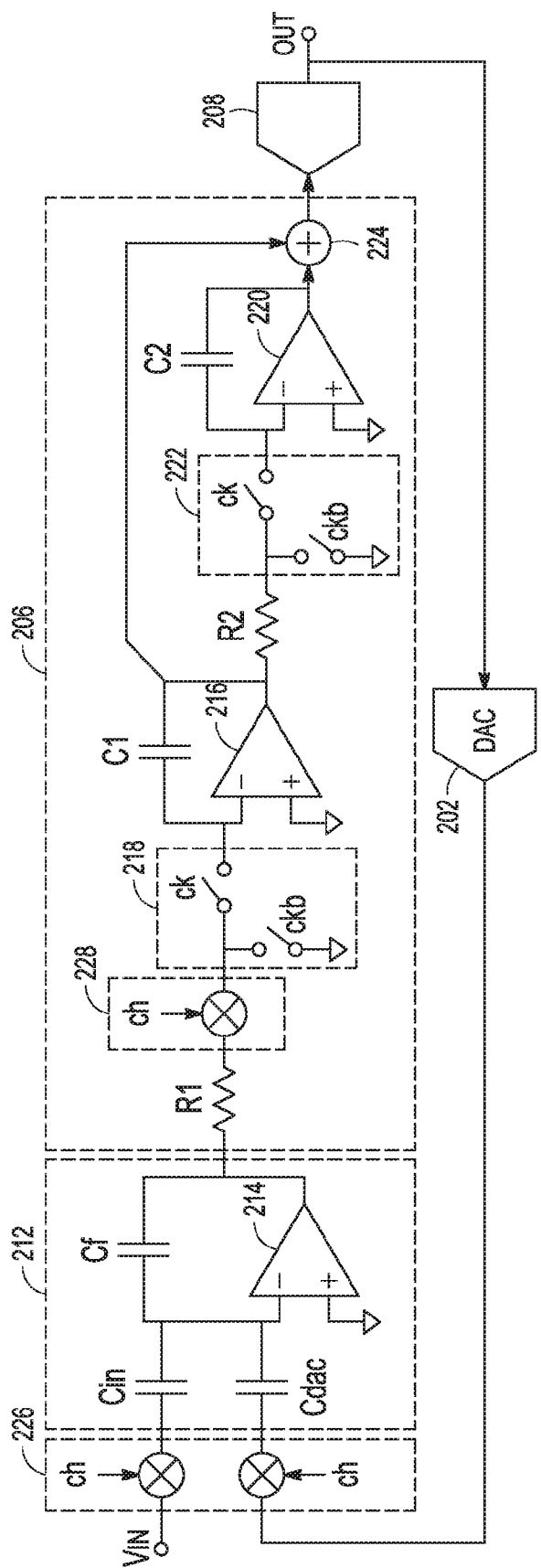
FIG. 2 is a block diagram of portions of an example of a sigma delta ADC.

FIG. 2 is a block diagram of portions of another example of a sigma delta ADC. The sigma delta ADC includes a DAC circuit 202, a loop filter circuit 206, and a sub-ADC circuit 208. The loop filter circuit 206 includes a first integrator circuit including operational amplifier (op-amp) 216, resistor R1, and capacitor C1, and a second integrator circuit including op-amp 220, resistor R2, and capacitor C2. The sub-ADC circuit 208 may include a latched comparator circuit to provide a one-bit A/D conversion. In some examples, the sub-ADC circuit includes a flash ADC circuit that can provide a multi-bit analog-to-digital (A/D) conversion.

The sigma delta ADC also includes a capacitive gain amplifier circuit 212 instead of a summing element. The capacitive gain amplifier circuit receives an input voltage Vin at one input and receives the output from the DAC circuit 202 at the other input. The capacitive gain amplifier circuit 212 includes a first input capacitor (Cin), a second input capacitor (Cdac) and an op amp (214). The input capacitors are connected to the inverting node of the op amp. A feedback capacitor Cf is connected from the inverting node to the output of the op amp 214. The gain of the capacitive gain amplifier circuit 212 is determined by the ratio Cin/Cf. Accuracy of the gain is determined by matching capacitors instead of resistors. Circuit noise in the sigma delta of FIG. 2 may be dominated by the capacitive gain stage as the noise is divided by the gain stage when referred back to the input. However, because the capacitors are noiseless the only noise source is due to the op-amp 214. This makes the capacitive gain amplifier a very low noise input stage.

A further reduction in noise is provided by the filtering of the loop filter circuit 206 before the noise can be sampled by the sub-ADC circuit 208. The loop filter circuit 206 in the example of FIG. 2 is a second order filter and includes two integrators. The first integrator circuit includes the resistor R1, the op amp 216, and the integrating capacitor C1 connected between the inverting node and the output of the op amp 216. The first integrator circuit 206 also includes a switching circuit 218. The second integrator circuit includes the resistor R2, the op-amp 220, integrating capacitor C2 and switching circuit 222. The output of the capacitive gain amplifier circuit 212 is applied to R1 of the first integrator circuit. A summing node 224 receives the outputs of the first and second integrator stages and the summed outputs are provided to the input of the sub-ADC circuit 208. The second order filter reduces aliasing noise from the capacitive gain amplifier that can fold in-band to the sigma delta ADC. The loop filter circuit 206 can be a continuous time filter circuit in contrast to a discrete time filter circuit.

The switching circuit 218, switching circuit 222, and the DAC circuit 202 are controlled by clock signal ck (ckb is the inverted signal ck). The integrator circuit can be enabled to integrate an electrical signal received from the capacitive gain amplifier during a first voltage level (e.g., the high level) of the clock signal and the DAC circuit 202 can be enabled to convert the output of the sub-ADC circuit during the other voltage level (e.g., the low level) of the clock signal while integrating is disabled. In certain examples, the DAC circuit 202 is enabled and updates on the falling edge of ck.

Figure 3:
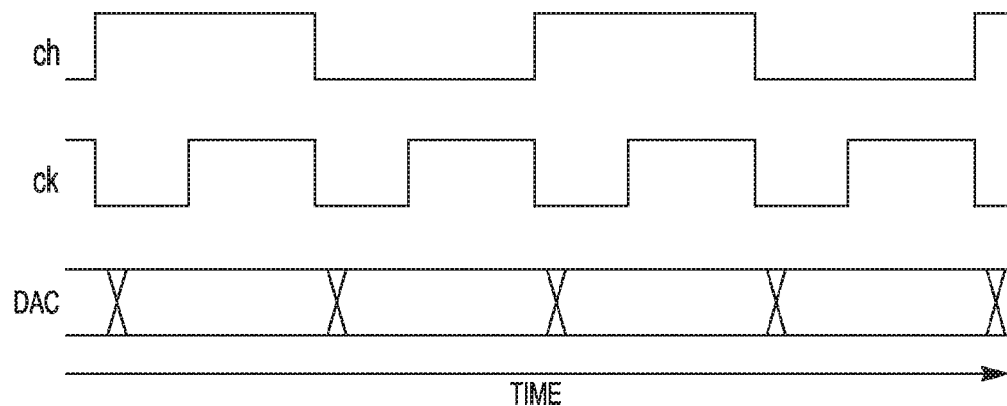
FIG. 3 is an example of a timing diagram of clock signals to operate a sigma delta ADC.

FIG. 3 is an example of a timing diagram of switch clock signal ck and the output of the DAC circuit 202. The integrator circuit 206 integrates the signal provided from the capacitive gain amplifier circuit 212 when switch clock signal ck is high and the signal is removed from the integrator circuit when switch clock signal ck is low. The DAC circuit 202 converts the digital value at the output back to an analog voltage level when clock signal ck is low. This also gives the output of the capacitive gain stage time to settle due to the changing of the DAC output before it is applied to the integrator circuit 206. Extending the duration of the low level phase allows the sigma delta ADC to work at a lower frequency without requiring integration capacitors with very large values of capacitance. The voltage across the integrating capacitors is proportional to the integration time. Thus, the longer the integration time, the larger the amount of charge accumulated on the integration capacitors, and potentially, the larger the voltage across the capacitors.

Figure 4:
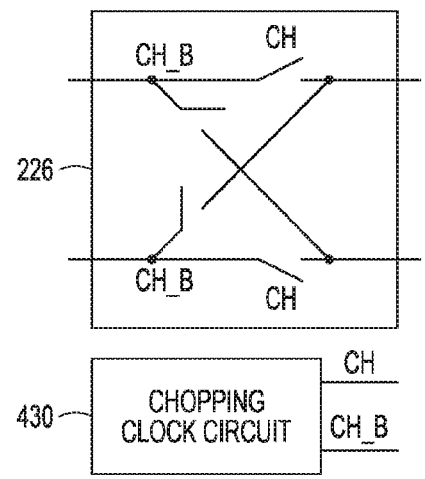
FIG. 4 is a schematic of an example of a signal chopper circuit.

According to some examples, the sigma delta ADC includes a signal chopper circuit 226 at the inputs to the capacitive gain amplifier circuit 212, and a second signal chopper circuit 228 included in the integrator circuit 206. FIG. 4 is a schematic of an example of signal chopper circuit 226. The signal chopper circuit may be a differential chop circuit that operates according to chop clock signals CH and CH_B provided by chopping clock circuit 430. When the chopper clock phase CH is high, the differential signal at the input to the circuit is passed. When chopper clock phase CH_B is high, the differential signal at the input to the circuit is inverted. When CH is high or "on," CH_B is low or "off", and vice versa.

The first signal chopper circuit 226 changes the orientation of the signals input to the capacitive gain amplifier circuit 212, and the second signal chopper circuit 228 changes the orientation of the amplifier output signal. The resistor R1 of the first integrator stage is included between the signal chopper circuits. Hence the 1/f noise or flicker noise of R1 is chopped out of the signal being integrated. Resistor R2 is included after the first integrator stage and the noise contribution from R2 is negligible.

The signal chopper circuits in FIG. 2 are controlled by a chop clock signal ch. The clock period of the chop clock signal can be a multiple of the clock period of clock signal ck. In FIG. 3, the period of the chop clock signal is twice the clock period of clock signal ck. The state of the signal chopper circuits changes on the edge of the chop clock signal. In FIG. 3, if the integrator circuit integrates during the high level of ck, the integrator will not be integrating when the signal chop circuits change state.

Figure 5:
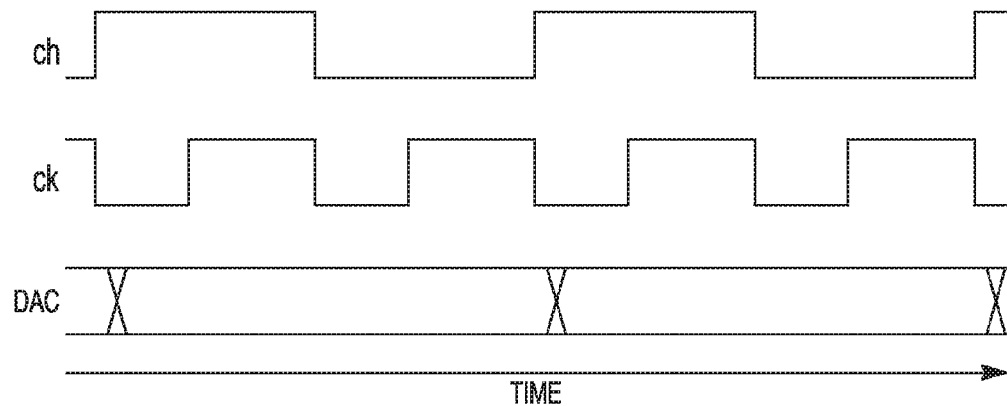
FIG. 5 is another example of a timing diagram of clock signals to operate a sigma delta ADC.

In some examples, the update period of the DAC circuit 202 is a multiple of the period of the chop clock signal ch. FIG. 5 is an example of a timing diagram of the switch clock signal ck, the chop clock signal ch, and the output of the DAC circuit 202. The DAC update period is equal to one period of the chop clock signal ch. The chop clock period includes two phases of the chop clock signal ch: one phase for ch high (the phase where the signal is passed through unchanged) and one phase for ch low (the phase where the signal is inverted). In this way, the DAC value fed back by DAC circuit 202 is subject to the same number of chop phases. The DAC value fed back may change slightly depending on the chop phase, which may potentially introduce an error and degrade performance. If the DAC value fed back is always applied with both chop phases, the potential error is reduced.

Figure 6:
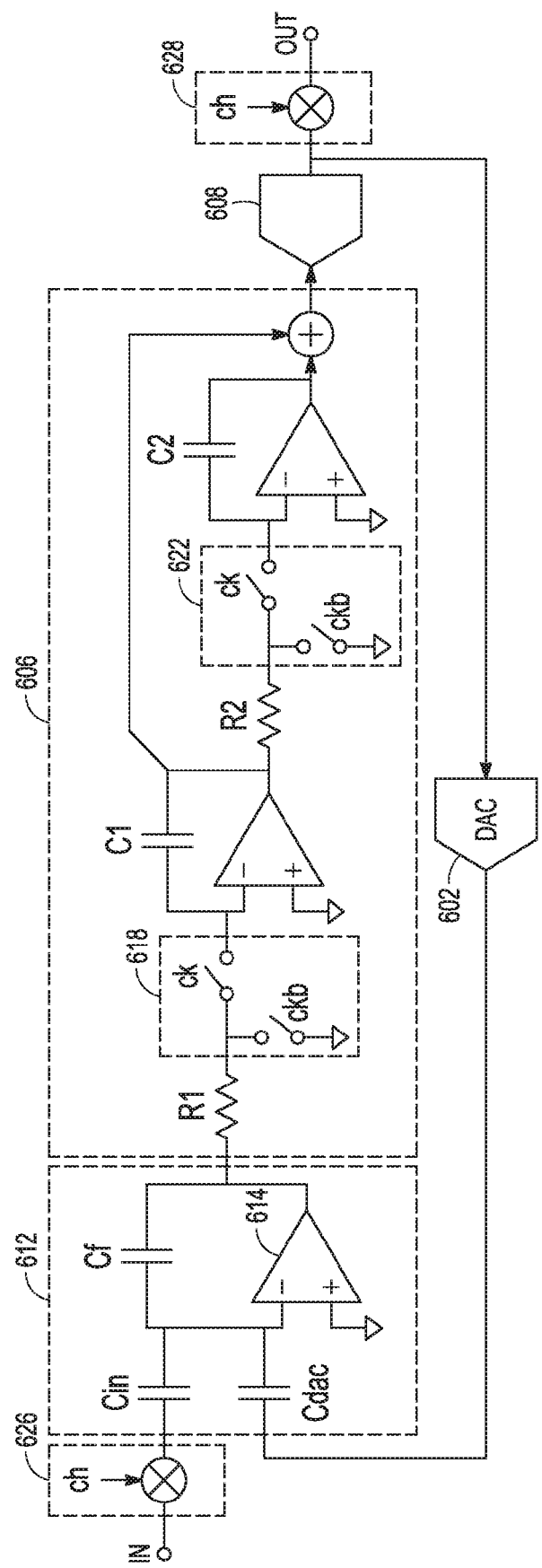
FIG. 6 is a block diagram of portions of another example of a sigma delta ADC.

FIG. 6 is a block diagram of portions of another example of a sigma delta ADC. The sigma delta ADC includes a DAC circuit 602, a loop filter circuit 606, a sub-ADC circuit 608, a capacitive gain amplifier 612, and switching circuits 618 and 622. The sigma delta ADC includes two signal chopper circuits. One signal chopper circuit 626 is arranged at the input to the sigma delta circuit and the other signal chopper circuit 628 is arranged at the output of the signal delta circuit at the output to the sub-ADC circuit 608. As in the example of FIG. 2, the loop filter circuit 606 can be enabled to integrate an electrical signal received from the capacitive gain amplifier 612 during a first voltage level of the clock signal ck, and the DAC circuit 602 can be enabled to convert the output of the sub-ADC circuit 608. The signal chopper circuit 626 at the input translates the input signal to a higher frequency. The frequency of the chop clock can be increased to a point where the 1/f noise of the ADC can be avoided (e.g., the 1/f noise of the op-amp 614 of the capacitive gain amplifier or the 1/f noise of resistor R1 of the integrator circuit 606). The chopper circuit 628 at the output translates the wanted signal back to the original frequency while up-converting the 1/f noise and offset of the ADC to higher frequencies. A decimating filter following the sigma delta ADC can then be used to reject the up-converted 1/f noise and offset of the ADC.

The sub-ADC circuit in FIGS. 2 and 6 can include a latched comparator circuit. In some examples, the sub-ADC circuit is an N bit Flash ADC circuit, N being an integer greater than one (e.g., N=2, or N=3). Thus for example, the sigma delta ADC could provide a two-bit digital value at the conversion rate. The loop filter circuits of FIGS. 2 and 6 can provide low pass filtering, band pass filtering, or high pass filtering. In certain examples, the DAC circuits of FIGS. 2 and 6 can be implemented to reuse the capacitor Cdac as a capacitive DAC. In regard to the capacitive gain amplifiers, biasing the inputs to the op-amp used in the capacitive gain amplifiers can be an issue. An example of a method to bias such op-amps can be found in Lyden et al. (U.S. Pat. No. 8,791,754), Programmable Gain Amplifier with Amplifier Common Mode Sampling System, filed Aug. 22, 2012, which is incorporated herein by reference in its entirety.

Figure 7:
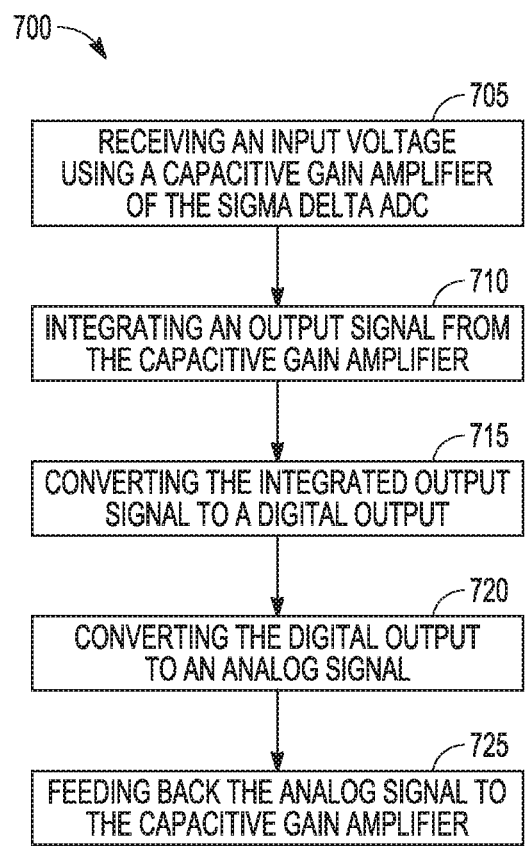
FIG. 7 is a flow diagram of a method of controlling operation of a sigma delta ADC.

FIG. 7 is a flow diagram of a method 700 of controlling operation of a sigma delta AD). At 705, an input voltage is received using a capacitive gain amplifier of the sigma delta ADC. At 710, an output signal from the capacitive gain amplifier is filtered. In some examples, this includes filtering the output signal during a first phase of a clock signal. At 715, the filtered output signal is converted to a digital output. In some examples, this includes converting the digital input during a second phase of the clock signal. At 720, the digital output is converted back to an analog signal, and at 725, the converted analog signal is fed back to an input of the capacitive gain amplifier.

Figure 8:
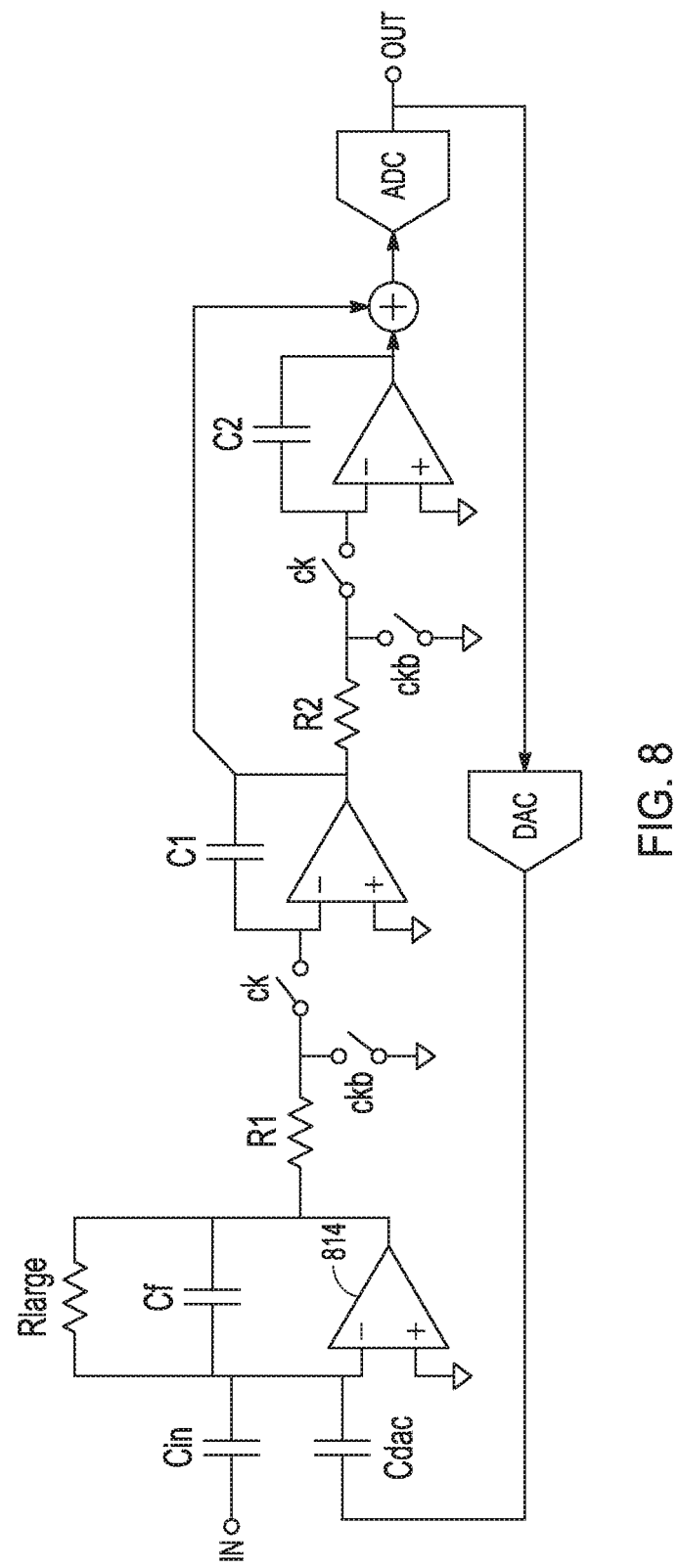
FIG. 8 is a block diagram of portions of another example of a sigma delta ADC.

FIG. 8 is a block diagram of portions of another example of a sigma delta ADC. This example can be used where only alternating current (AC) signals are of interest. The ADC does not include chopper circuits, and the input of the op-amp 814 of the capacitive gain amplifier is biased using a very large resistor (Rlarge). The large resistance can be implemented using a metal oxide semiconductor (MOS) transistor biased in the off-state. The ADC cannot convert DC input signals because the input capacitances block any DC voltage. However, AC signals can still be converted by the ADC, and the ADC can still provide a very low noise floor for this class of signals.

FIG. 2, FIG. 6, and FIG. 8 show examples of sigma delta ADCs where integrator circuits are not integrating all of the time. Part of the time, the loop filter circuit is disconnected from the capacitive gain amplifier. This time slot can be used to disconnect the loop filter from the capacitive gate array and update the DAC and update the inputs to the capacitive gate array. Because the loop filter is disconnected, it does not see the non-linear behavior of the DAC and capacitive gate array when the DAC transitions to a new DAC value or signals at the capacitive gate array are chopped, which may cause the amplifier of the capacitive gate array to slew. However, not having the input signal continuously connected to the loop filter circuit may have drawbacks. For instance, the anti-aliasing property of the continuous time sigma delta ADC can be reduced by disconnecting the loop filter circuit.

Figure 9:
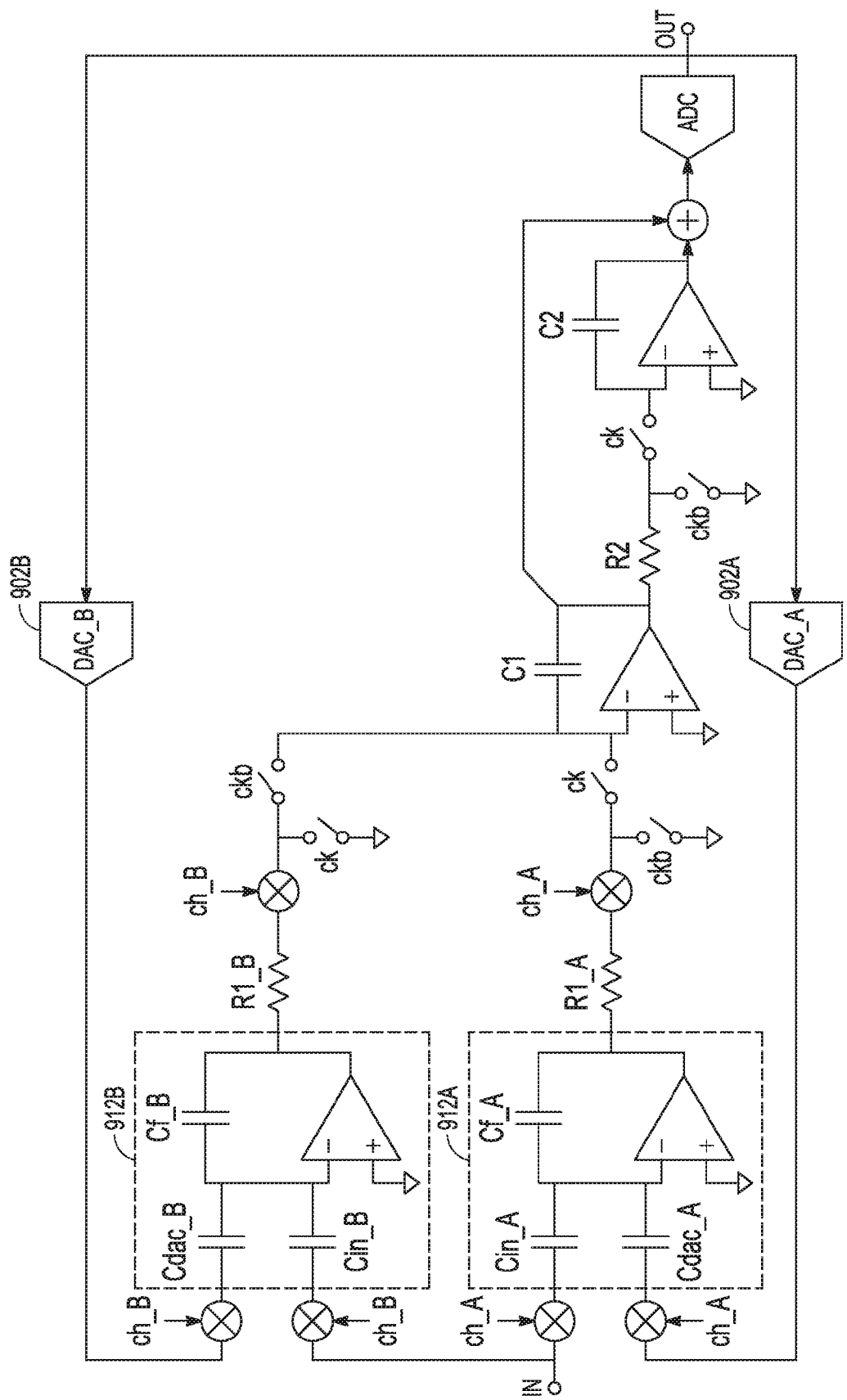
FIG. 9 is a block diagram of portions of still another example of a sigma delta ADC.

FIG. 9 is a block diagram of portions of another example of a sigma delta ADC. To avoid some of the drawbacks associated with the disconnection of the loop filter, the sigma delta ADC includes two capacitive gain amplifiers 912A and 912B. Operation of the ADC can involve switching back and forth or "ping-ponging" between using the two capacitive gain amplifiers. The sigma delta ADC includes two DAC circuits; a first DAC circuit 902A associated with the first capacitive gain amplifier 912A and a second DAC circuit 902B associated with the second capacitive gain amplifier 912B. When one capacitive gain amplifier and its associated DAC are updating, the other capacitive gain amplifier and its associated DAC circuit are connected to the loop filter circuit and vice versa. In this way, the input signal can be continuously connected to the loop filter circuit through one other of the capacitive gain amplifiers, and the loop filter circuit can still be protected from the slewing of amplifiers and non-linear transitions of the DACs.

Figure 10:
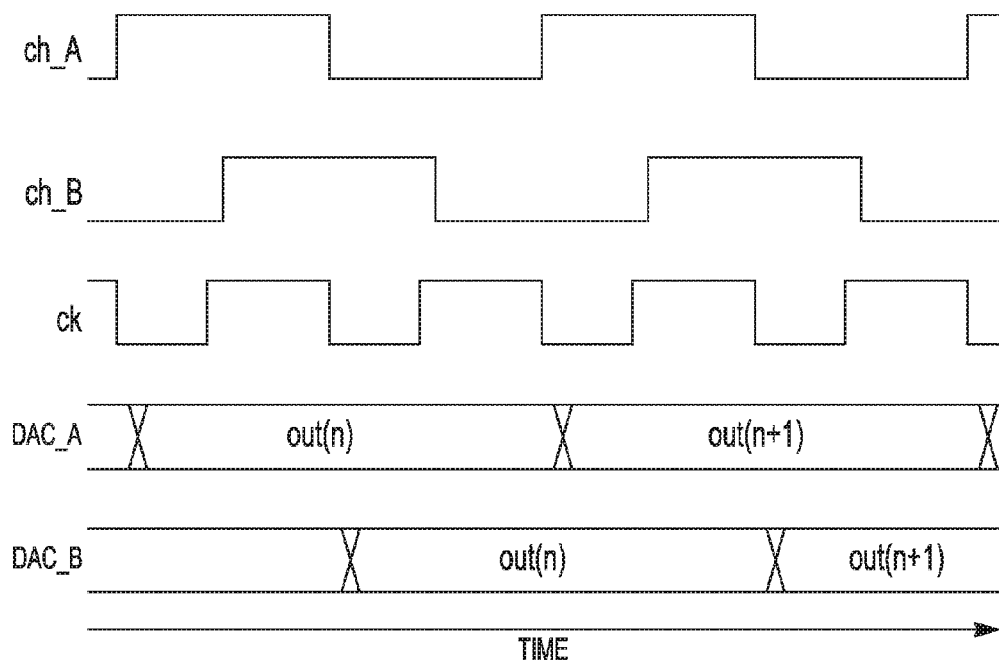
FIG. 10 is an example of a timing diagram of clock signals to operate the sigma delta ADC of FIG. 9.

FIG. 10 is an example of a timing diagram of clock signals to operate a sigma delta ADC. The clock signals include the switch clock signal ck, and the two chop clock signals ch_A, and chop clock signal ch_B. The timing diagram also shows the outputs of the two DAC circuits DAC_A and DAC_B. The update period of a DAC is equal to one period of a chop clock signal ch. The output DAC_A of the first DAC 902A updates on a specified phase of chop clock signal ch_A, and the output DAC_B of the second DAC updates on a specified phase of chop clock signal ch_B. The chop clock signals are a multiple of the switch clock signal ck. The switch clock signal may have a duty cycle of 50% and both of the capacitive gain amplifiers are active for the same duration of time.

The several devices and methods described reduce the circuit noise of a sigma delta ADC and provide improved performance in converting DC input signals.

Additional Description and Examples

Example 1 includes subject matter (such as a sigma delta analog-to-digital converter (ADC)) comprising: a capacitive gain amplifier circuit having a first input to receive an input voltage and a second input; a loop filter circuit connected to an output of the capacitive gain amplifier circuit; a sub-ADC circuit including an output and an input connected to an output of the loop filter circuit; and a digital-to-analog (DAC) circuit including a DAC input connected to the output of the sub-ADC circuit, and a DAC output connected to the second input of the capacitive gain amplifier.

In Example 2, the subject matter of Example 1 optionally includes a loop filter circuit that is a continuous time filter circuit.

In Example 3, the subject matter of Example 1 includes a loop filter circuit that includes a switching circuit, wherein the switching circuit and the DAC circuit are controllable by a switch clock signal, wherein the loop filter circuit is enabled to integrate an electrical signal received from the capacitive gain amplifier circuit during a first voltage level of the switch clock and the DAC circuit is enabled to convert the output of the sub-ADC circuit during a second voltage level of the switch clock signal.

In Example 4, the subject matter of one or any combination of Examples 1-3 optionally includes a loop filter circuit that includes a first integrator stage, a second integrator stage, and a summing node connected to outputs of the first and second integrator stages, wherein the input of the sub-ADC circuit is connected to the summing node.

In Example 5, the subject matter of one or any combination of Examples 1-4 optionally includes a first signal chopper circuit arranged at the first and second inputs to the capacitive gain amplifier circuit, and a second signal chopper circuit included in the loop filter circuit, wherein the first and second signal chopper circuits are controlled by a chop clock signal, wherein the loop filter circuit includes a switching circuit controllable by a switch clock signal and the loop filter circuit is enabled to integrate an electrical signal received from the capacitive gain amplifier circuit according to the switch clock signal, and the DAC circuit is enabled to convert the output of the sub-ADC circuit according to the chop clock signal.

In Example 6, the subject matter of Example 5 optionally includes a clock period of the chop clock signal is a multiple of a clock period of the switch clock signal.

In Example 7, the subject matter of one or any combination of Examples 1-4 optionally includes a first signal chopper circuit arranged at the first and second inputs of the capacitive gain amplifier circuit, and a second signal chopper circuit included in the loop filter circuit, wherein the loop filter circuit includes a resistor arranged between the first signal chopper circuit and the second signal chopper circuit.

In Example 8, the subject matter of one or any combination of Examples 1-4 optionally includes a first signal chopper circuit arranged at the first input to the capacitive gain stage, and a second signal chopper circuit arranged at the output of the sub-ADC circuit, wherein the first and second signal chopper circuits are controlled by a chop clock signal, wherein the loop filter circuit includes a switching circuit controlled by a switch clock signal and the loop filter circuit is enabled to integrate an electrical signal received from the capacitive gain amplifier using a specified phase of the switch clock signal, and the DAC circuit is enabled to convert the output of the sub-ADC circuit using a specified phase of the chop clock signal.

In Example 9, the subject matter of one or any combination of Examples 1-8 optionally includes a sub-ADC circuit including a latched comparator circuit.

In Example 10, the subject matter of one or any combination of Examples 1-9 optionally includes a sub-ADC circuit including a Flash ADC circuit.

In Example 11, the subject matter of Example 10 optionally includes a Flash ADC circuit that is an N bit Flash ADC circuit, wherein N is an integer greater than one.

In Example 12, the subject matter of one or any combination of Examples 1-11 optionally includes: a second capacitive gain amplifier circuit having a first input to receive the input voltage, a second input, and an output connected to the loop filter circuit; and a second DAC circuit including a DAC input connected to the output of the sub-ADC circuit and a DAC output connected to the second input of the second capacitive gain amplifier.

In Example 13, the subject matter of Example 12 optionally includes a first signal chopper circuit arranged at the first and second inputs to the first capacitive gain amplifier circuit, and a second signal chopper circuit arranged at the first and second inputs of the second capacitive gain amplifier circuit, wherein the first DAC circuit is enabled to convert the output of the sub-ADC circuit according to the first chop clock signal and the second DAC circuit is enabled to convert the output of the sub-ADC circuit according to the second chop clock signal.

Example 14 can include subject matter (such as a method of operating a sigma delta analog-to-digital converter (ADC) circuit), or can be combined with any combination of Examples 1-13 to include such subject matter, comprising: receiving an input voltage using a capacitive gain amplifier of the sigma delta ADC; filtering an output signal from the capacitive gain amplifier; converting the filtered output signal to a digital output; converting the digital output to an analog signal; and feeding back the analog signal to the capacitive gain amplifier.

In Example 15 the subject matter of Example 14 optionally includes filtering the output signal during a first phase of a clock signal and wherein converting the digital input to an analog signal includes converting the digital input during a second phase of the clock signal.

In Example 16, the subject matter of one or both of Examples 14 and 15 optionally includes chopping input signals to the capacitive gain amplifier and the output signal from the capacitive gain amplifier using a chop clock signal, and wherein filtering the output signal from the capacitive gain amplifier includes filtering the output signal during a specified phase of a switch clock signal, wherein converting the digital output to an analog signal includes converting the digital output using a specified phase of the chopping clock signal, and wherein a clock period of the chop clock signal is a multiple of a clock period of the switch clock signal.

In Example 17, the subject matter of one or any combination of Examples 14-16 optionally includes applying the output signal from the capacitive gain amplifier to a resistor and chopping the input voltage received at the capacitive gain amplifier and the output signal from the resistor to reduce circuit noise.

In Example 18, the subject matter of one or any combination of Examples 14-17 optionally includes filtering the output signal using a second order loop filter circuit.

In Example 19, the subject matter of one or any combination of Examples 14-18 optionally includes chopping the input voltage received by the capacitive gain amplifier and the digital output using a chop clock signal; and wherein filtering the output signal from the capacitive gain amplifier includes filtering the output signal during a specified phase of a switch clock signal, wherein converting the digital output to an analog signal includes converting the digital output using a specified phase of the chopping clock signal, and wherein a clock period of the chop clock signal is a multiple of a clock period of the switch clock signal.

In Example 20, the subject matter of one or any combination of Examples 14-19 optionally includes converting the filtered output signal to a digital output using a latched comparator circuit.

In Example 21, the subject matter of one or any combination of Examples 14-21 optionally includes converting the filtered output signal to a digital output using a Flash ADC circuit.

Example 22 can include subject matter (such as an analog-to-digital converter (ADC) circuit), or can optionally be combined with one or any combination of Examples 1-21 to include such subject matter, comprising: a capacitive gain amplifier circuit including: a first operation amplifier (op amp); a first input capacitor and a second input capacitor connected to an inverting node of the first op amp; and a feedback capacitor connected from the inverting node to an output of the first op amp; a first signal chopper circuit connected to the first and second input capacitors and including a first input to receive an input voltage; a filter circuit including: a second op amp; a resistor connected to an output of the capacitive gain amplifier circuit, an integrating capacitor connected between an inverting node and an output of the second op amp; and a second signal chopper circuit and a switching circuit arranged between the resistor and the second op amp; a sub-ADC circuit connected to an output of the filter circuit; and a digital-to-analog (DAC) circuit to receive the output of the sub-ADC circuit, and provide a DAC output to a second input of the first signal chopper circuit.

In Example 23, the subject matter of Example 22 optionally includes first and second signal chopper circuits controlled by a chop clock signal, wherein the switching circuit is controllable by a switch clock signal to enable and disable the filter circuit according to the switch clock signal, and the DAC circuit is enabled to convert the output of the sub-ADC circuit according to the chop clock signal when the filter circuit is disabled.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A sigma delta analog-to-digital converter (ADC) comprising:
   a capacitive gain amplifier circuit having a first input to receive an input signal and a second input, wherein the capacitive gain amplifier circuit is configured to amplify the input signal;
   a first signal chopper circuit arranged at the first and second inputs of the capacitive gain amplifier circuit, and a second signal chopper circuit included in the loop filter circuit, wherein the loop filter circuit includes a resistor arranged between the first signal chopper circuit and the second signal chopper circuit:
   a sub-ADC circuit including an output and an input connected to an output of the loop filter circuit and configured to sample the amplified and filtered input signal and convert the amplified filtered input signal to a digital output; and
   a digital-to-analog (DAC) circuit including a DAC input connected to the output of the sub-ADC circuit, and a DAC output connected to the second input of the capacitive gain amplifier, wherein the capacitive gain amplifier circuit is configured to divide down a signal received at the second input by a gain of the capacitive gain amplifier circuit.

2. The sigma delta ADC of claim 1, wherein the loop filter circuit is a continuous time filter circuit.

3. The sigma delta ADC of claim 1, wherein the loop filter circuit includes a switching circuit, wherein the switching circuit and the DAC circuit are controllable by a switch clock signal, wherein the loop filter circuit is enabled to integrate an electrical signal received from the capacitive gain amplifier circuit during a first voltage level of the switch clock and the DAC circuit is enabled to convert the output of the sub-ADC circuit during a second voltage level of the switch clock signal.

4. The sigma delta ADC of claim 3, wherein the loop filter circuit includes a first integrator stage, a second integrator stage, and a summing node connected to outputs of the first and second integrator stages, wherein the input of the sub-ADC circuit is connected to the summing node.

5. The sigma delta ADC of claim 1, including a first signal chopper circuit arranged at the first and second inputs to the capacitive gain amplifier circuit, and a second signal chopper circuit included in the loop filter circuit, wherein the first and second signal chopper circuits are controlled by a chop clock signal, wherein the loop filter circuit includes a switching circuit controllable by a switch clock signal and the loop filter circuit is enabled to integrate an electrical signal received from the capacitive gain amplifier circuit according to the switch clock signal, and the DAC circuit is enabled to convert the output of the sub-ADC circuit according to the chop clock signal.

6. The sigma delta ADC of claim 5, wherein a clock period of the chop clock signal is a multiple of a clock period of the switch clock signal.

7. The sigma delta ADC of claim 1, including a first signal chopper circuit arranged at the first input to the capacitive gain stage, and a second signal chopper circuit arranged at the output of the sub-ADC circuit, wherein the first and second signal chopper circuits are controlled by a chop clock signal, wherein the loop filter circuit includes a switching circuit controlled by a switch clock signal and the loop filter circuit is enabled to integrate an electrical signal received from the capacitive gain amplifier using a specified phase of the switch clock signal, and the DAC circuit is enabled to convert the output of the sub-ADC circuit using a specified phase of the chop clock signal.

8. The sigma delta ADC of claim 1, wherein the sub-ADC circuit includes a latched comparator circuit.

9. The sigma delta ADC of claim 1, wherein the sub-ADC circuit includes a Flash ADC circuit.

10. The sigma delta ADC of claim 9, wherein the Flash ADC circuit is an N bit Flash ADC circuit, wherein N is an integer greater than one.

11. A sigma delta analog-to-digital converter (ADC) comprising:
    a capacitive gain amplifier circuit having a first input to receive an input signal and a second input, wherein the capacitive gain amplifier circuit is configured to amplify the input signal;
    a loop filter circuit connected to an output of the capacitive gain amplifier circuit and configured to filter the amplified input signal;
    a sub-ADC circuit including an output and an input connected to an output of the loop filter circuit and configured to sample the amplified and filtered input signal and convert the amplified filtered input signal to a digital output;
    a digital-to-analog (DAC) circuit including a DAC input connected to the output of the sub-ADC circuit, and a DAC output connected to the second input of the capacitive gain amplifier, wherein the capacitive gain amplifier circuit is configured to divide down a signal received at the second input by a gain of the capacitive gain amplifier circuit;
    a second capacitive gain amplifier circuit having a first input to receive the input voltage, a second input, and an output connected to the loop filter circuit; and a second DAC circuit including a DAC input connected to the output of the sub-ADC circuit and a DAC output connected to the second input of the second capacitive gain amplifier.

12. The sigma delta ADC of claim 11, including a first signal chopper circuit arranged at the first and second inputs to the first capacitive gain amplifier circuit, and a second signal chopper circuit arranged at the first and second inputs of the second capacitive gain amplifier circuit, wherein the first DAC circuit is enabled to convert the output of the sub-ADC circuit according to the first chop clock signal and the second DAC circuit is enabled to convert the output of the sub-ADC circuit according to the second chop clock signal.

13. A method of controlling operation of a sigma delta analog-to-digital converter (ADC), the method comprising:
receiving an input signal using a gain stage that includes a capacitive gain amplifier of the sigma delta ADC, wherein the gain stage amplifies the input signal;
filtering the amplified input signal from the capacitive gain amplifier, wherein the filtering the output signal from the capacitive gain amplifier includes applying the output signal from the capacitive gain amplifier to a resistor and chopping the input voltage received at the capacitive gain amplifier and the output signal from the resistor to reduce circuit noise;
sampling the amplified and filtered input signal;
converting the amplified and filtered input signal to a digital output;
converting the digital output to an analog signal; and
feeding back the analog signal to the capacitive gain amplifier and dividing the analog signal by a gain of the gain stage.

14. The method of claim 13, wherein the filtering the output signal from the capacitive gain amplifier includes filtering the output signal during a first phase of a clock signal and wherein converting the digital input to an analog signal includes converting the digital input during a second phase of the clock signal.

15. The method of claim 13, including:
chopping input signals to the capacitive gain amplifier and the output signal from the capacitive gain amplifier using a chop clock signal; and
wherein filtering the output signal from the capacitive gain amplifier includes filtering the output signal during a specified phase of a switch clock signal, wherein converting the digital output to an analog signal includes converting the digital output using a specified phase of the chopping clock signal, and wherein a clock period of the chop clock signal is a multiple of a clock period of the switch clock signal.

16. The method of claim 13, wherein the filtering the output signal from the capacitive gain amplifier includes filtering the output signal using a second order loop filter circuit.

17. The method of claim 13, including:
chopping the input voltage received by the capacitive gain amplifier and the digital output using a chop clock signal; and
wherein filtering the output signal from the capacitive gain amplifier includes filtering the output signal during a specified phase of a switch clock signal, wherein converting the digital output to an analog signal includes converting the digital output using a specified phase of the chopping clock signal, and wherein a clock period of the chop clock signal is a multiple of a clock period of the switch clock signal.

18. The method of claim 13, wherein the converting the filtered output signal to a digital output includes converting the filtered output signal to a digital output using a latched comparator circuit.

19. The method of claim 13, wherein the converting the filtered output signal to a digital output includes converting the filtered output signal to a digital output using a Flash ADC circuit.

20. An analog-to-digital converter (ADC) circuit comprising:
a capacitive gain amplifier circuit including:
a first operation amplifier (op amp);
a first input capacitor and a second input capacitor connected to an inverting node of the first op amp; and
a feedback capacitor connected from the inverting node to an output of the first op amp;
a first signal chopper circuit connected to the first and second input capacitors and including a first input to receive an input voltage;
a filter circuit including:
a second op amp;
a resistor connected to an output of the capacitive gain amplifier circuit, an integrating capacitor connected between an inverting node and an output of the second op amp; and
a second signal chopper circuit and a switching circuit arranged between the resistor and the second op amp;
a sub-ADC circuit connected to an output of the filter circuit; and
a digital-to-analog (DAC) circuit to receive the output of the sub-ADC circuit, and provide a DAC output to a second input of the first signal chopper circuit.

21. The ADC circuit of claim 20, wherein the first and second signal chopper circuits are controlled by a chop clock signal, wherein the switching circuit is controllable by a switch clock signal to enable and disable the filter circuit according to the switch clock signal, and the DAC circuit is enabled to convert the output of the sub-ADC circuit according to the chop clock signal when the filter circuit is disabled.

* * * * *